(12) United States Patent
Kam et al.

(10) Patent No.: US 8,879,346 B2
(45) Date of Patent: *Nov. 4, 2014

(54) MECHANISMS FOR ENABLING POWER MANAGEMENT OF EMBEDDED DYNAMIC RANDOM ACCESS MEMORY ON A SEMICONDUCTOR INTEGRATED CIRCUIT PACKAGE

(75) Inventors: Timothy Y. Kam, Portland, OR (US); Jay D. Schwartz, Aloha, OR (US); Seongwoo Kim, Beaverton, OR (US); Stephen H. Gunther, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 280 days.

This patent is subject to a terminal disclaimer.

(21) Appl. No.: 13/341,864

(22) Filed: Dec. 30, 2011

(65) Prior Publication Data
US 2012/0166822 A1    Jun. 28, 2012

(51) Int. Cl.
| | |
|---|---|
| *G11C 5/14* | (2006.01) |
| *G06F 1/32* | (2006.01) |
| *G11C 16/30* | (2006.01) |
| *G11C 11/4074* | (2006.01) |

(52) U.S. Cl.
CPC ............... *G06F 1/3275* (2013.01); *G11C 5/14* (2013.01); *G11C 5/143* (2013.01); *G11C 5/147* (2013.01); *G11C 16/30* (2013.01); *G11C 11/4074* (2013.01); *Y02B 60/1228* (2013.01); *Y02B 60/32* (2013.01)

USPC ............. 365/226; 365/102; 365/94; 365/149; 365/150; 365/189.17; 365/191; 365/227; 365/230.06; 365/233.13

(58) Field of Classification Search
CPC ...... G11C 5/147; G11C 5/14; G11C 11/4074; G11C 16/30; G11C 5/143
USPC .............. 365/102, 94, 149, 150, 189.17, 191, 365/226, 227, 229, 230.06, 233.13
See application file for complete search history.

(56) References Cited

U.S. PATENT DOCUMENTS 7,325,100 B2 * 1/2008 Dhiman et al. ............... 711/137
8,566,628 B2 * 10/2013 Branover et al. ............. 713/323

* cited by examiner

*Primary Examiner* — Fernando Hidalgo
(74) *Attorney, Agent, or Firm* — Blakely, Sokoloff, Taylor & Zafman LLP

(57) ABSTRACT

Power management of an embedded dynamic random access memory (eDRAM) by receiving an eDRAM power state transition event and determining both the current power state of the eDRAM and the next power state of the eDRAM from the power states of: a power-on state, a power-off state, and a self-refresh state. Using the current power state and the next power state to determine whether a power state transition is required, and, in the case that a power state transition is required, transition the eDRAM to the next power state. Power management is achieved because transitioning to a power-off state or self-refresh state reduces the amount of power consumed by the eDRAM as compared to the power-on state.

20 Claims, 13 Drawing Sheets

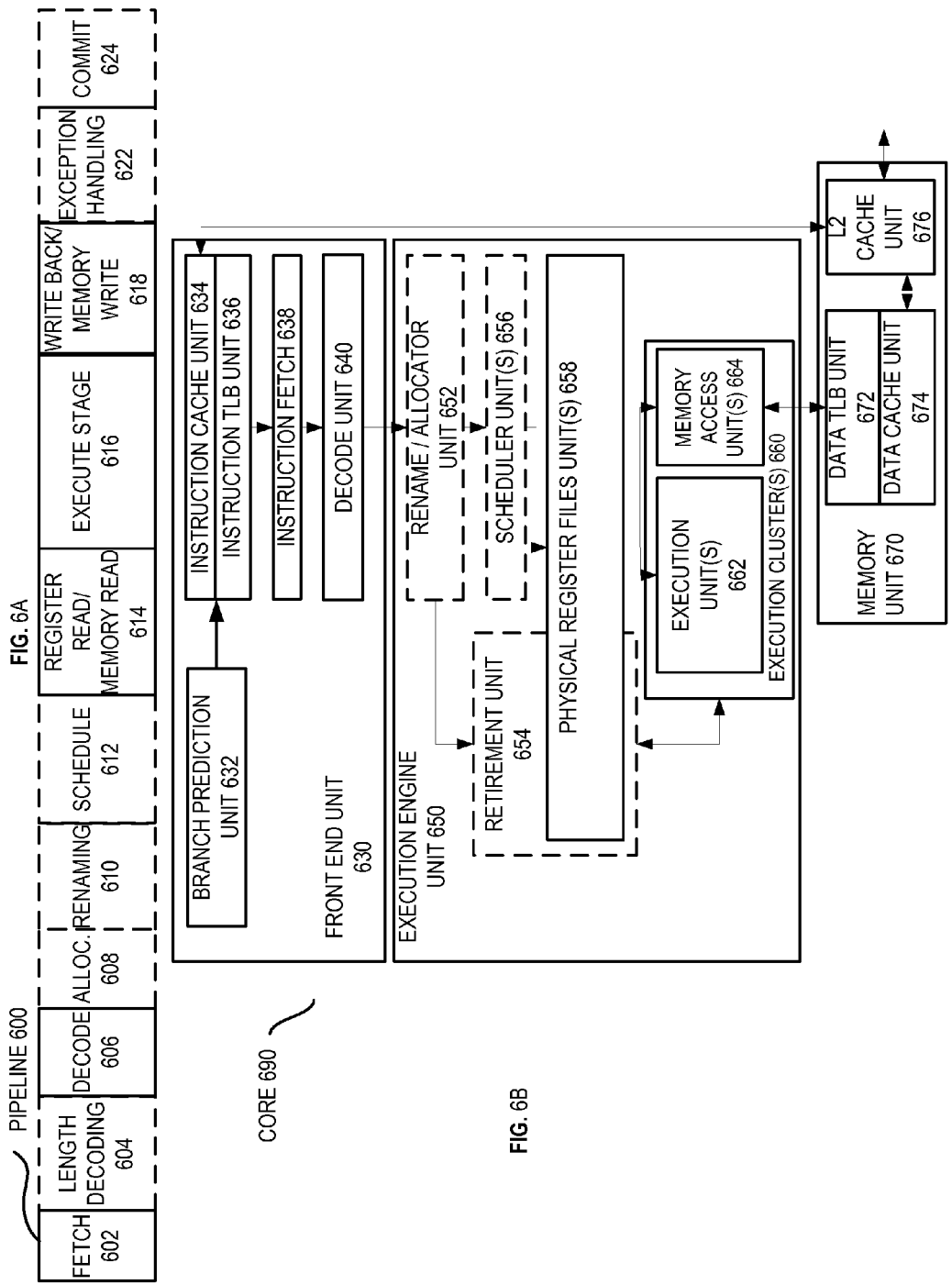

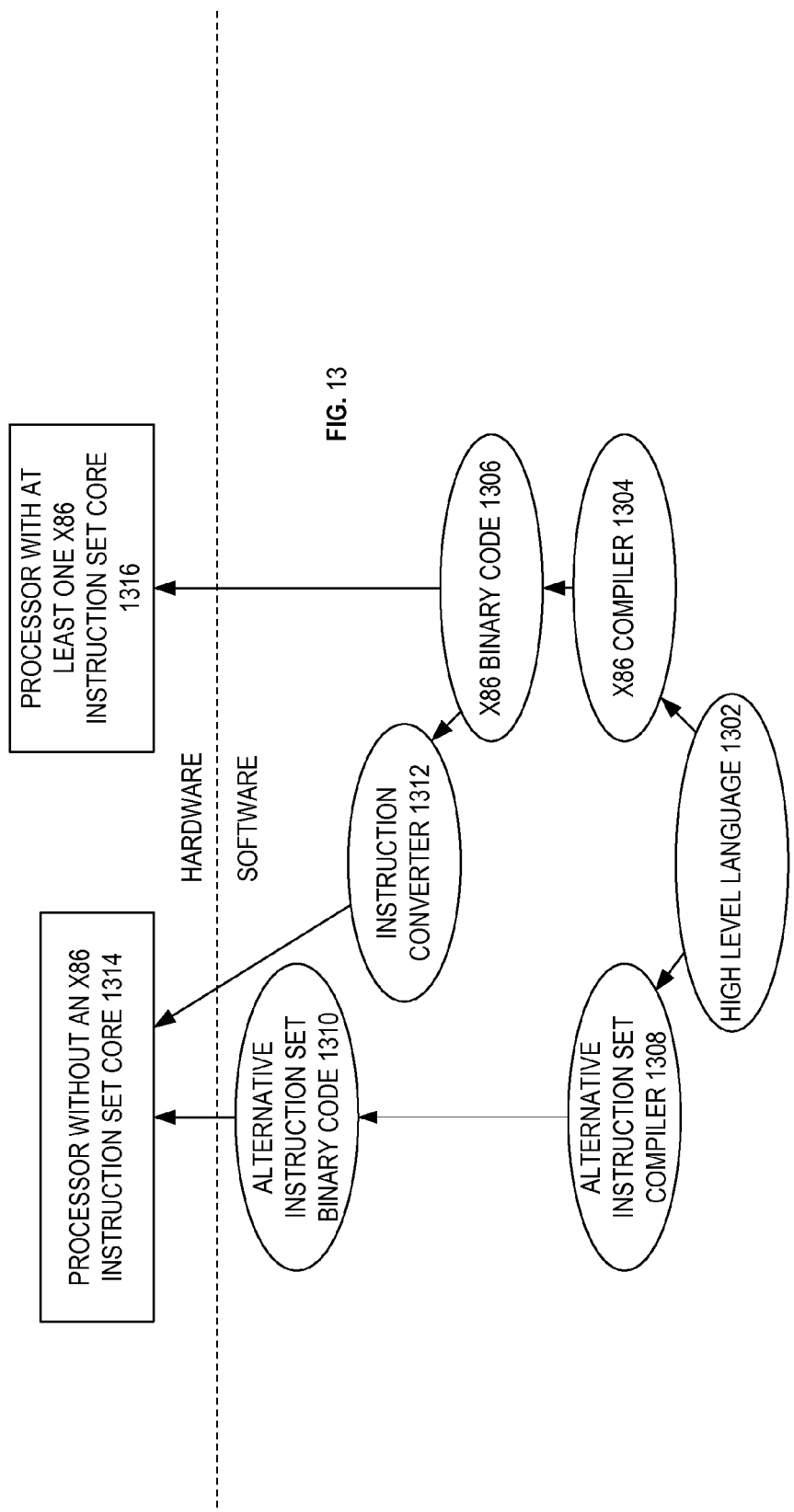

MECHANISMS FOR ENABLING POWER MANAGEMENT OF EMBEDDED DYNAMIC RANDOM ACCESS MEMORY ON A SEMICONDUCTOR INTEGRATED CIRCUIT PACKAGE

FIELD

Embodiments of the invention relate to the field of semiconductor integrated circuit packages; and more specifically, to power management of embedded dynamic random access memory in semiconductor integrated circuit packages.

BACKGROUND

Hardware designers continue to move memory closer and closer to the processor cores within computer systems. Now, dynamic random access memory is being included within the same packages, also known as semiconductor integrated circuit packages, as processors. This memory is referred to as embedded dynamic random access memory (eDRAM). Embedding DRAM on the same package as processing units allows designers to achieve higher speeds with lower latency. As such, eDRAM is a performance augmenter for multi-core and/or graphics processors. Serving as write-back cache, eDRAM improves premium integrated graphics performance and is effective in caching high-bandwidth multi-core traffic. However, eDRAM may not increase performance for other workloads.

Just as with other DRAM, an active eDRAM requires periodic refreshing of the capacitors that comprise the DRAM memory arrays as those capacitors leak charge. Thus, there is a level of power consumption associated with eDRAM even when the eDRAM is not being actively accessed. For example with different bandwidth of accesses and self-refresh, some eDRAM has been seen to consume 5 W of power while at other times, eDRAM has been seen to consume 68 W of power.

Furthermore, power management is becoming more challenging than ever before in all segments of computer-based systems. Optimizing systems for maximum or required performance at the minimum power consumption is usually done as a combination of software (operating system) and hardware elements. Most modern operating systems use the Advanced Configuration and Power Interface ("ACPI") standard. The ACPI processor sleep state control assumes that the core can be in different power-saving states (also termed sleep states or C-states) marked as C0 to Cn. However, there are currently no mechanisms for power management of eDRAM regardless of the operational state of the eDRAM or the processor cores. The processor cores can be general purpose such as central processors, or special purpose such as graphics engines or signal processors.

BRIEF DESCRIPTION OF THE DRAWINGS

The invention may best be understood by referring to the following description and accompanying drawings that are used to illustrate embodiments of the invention. In the drawings:

FIG. 6A is a block diagram illustrating both an exemplary in-order pipeline and an exemplary register renaming, out-of-order issue/execution pipeline according to embodiments of the invention;

FIG. 6B is a block diagram illustrating both an exemplary embodiment of an in-order architecture core and an exemplary register renaming, out-of-order issue/execution architecture core to be included in a processor according to embodiments of the invention;

FIG. 13 is a block diagram contrasting the use of a software instruction converter to convert binary instructions in a source instruction set to binary instructions in a target instruction set according to embodiments of the invention.

DESCRIPTION OF EMBODIMENTS

Figure 1:
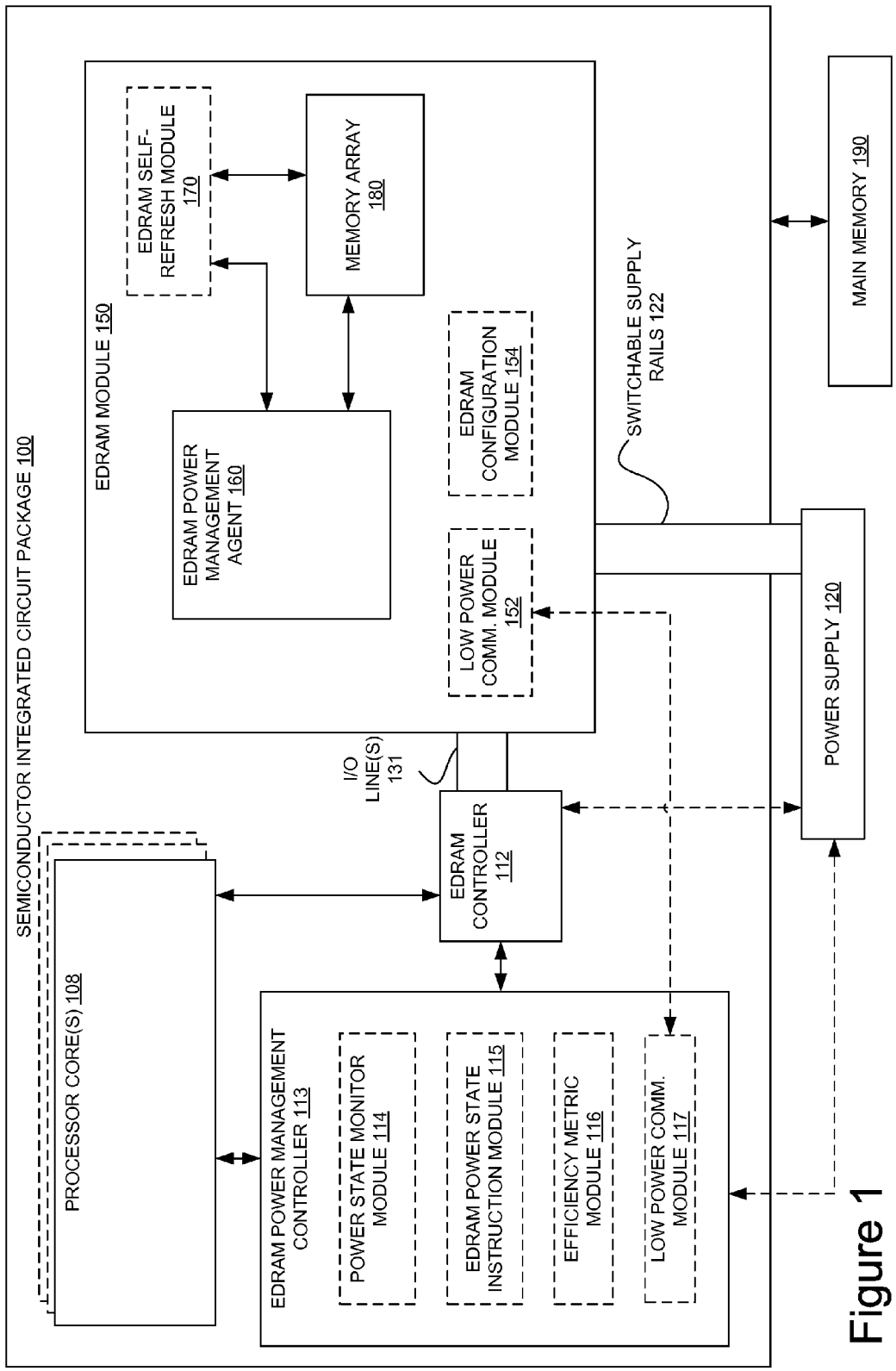
FIG. 1 is a block diagram illustrating semiconductor integrated circuit package including an embedded dynamic random access memory module according to an embodiment of the invention.

In the following description, numerous specific details such as logic implementations, opcodes, ways to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

It should also be appreciated that references to "one embodiment", "an embodiment", or "one or more embodiments", for example, mean that a particular feature may be included in the practice of embodiments of the invention, but every embodiment may not necessarily include the particular feature. Similarly, it should be appreciated that various features are sometimes grouped together in a single embodiment, figure, or description thereof for the purpose of streamlining the disclosure and aiding in the understanding of various inventive aspects. Further, when a particular feature, structure, or characteristic is described in connection with an embodiment, it is submitted that it is within the knowledge of one skilled in the art to effect such feature, structure, or characteristic in connection with other embodiments whether or not explicitly described. This method of disclosure, however, is not to be interpreted as reflecting an intention that more features than are expressly recited in each claim are required. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The operations of the flow diagrams will be described with reference to the exemplary embodiments of the block diagrams. However, it should be understood that the operations of flow diagrams can be performed by embodiments of the invention other than those discussed with reference to the block diagrams, and the embodiments discussed with reference to the block diagrams can perform operations different than those discussed with reference to the flow diagrams.

To ease understanding, dashed lines have been used in the figures to signify the optional nature of certain items (e.g., features not supported by a given implementation of the invention; features supported by a given implementation, but used in some situations and not in others).

FIG. 1 is a block diagram illustrating semiconductor integrated circuit package including an embedded dynamic random access memory module according to an embodiment of the invention. FIG. 1 shows a semiconductor integrated circuit package 100 comprising a set of one or more processing cores 108, an eDRAM power management controller 113, an eDRAM controller 112, and an eDRAM module (also referred to as an eDRAM) 150. The semiconductor integrated circuit package 100 is further coupled with a power supply 120 and coupled with a main memory 190.

In FIG. 1, the set of processor cores 108 communicates with the eDRAM controller 112 to issue commands, addresses, and data that are provided by the eDRAM controller 112 to the eDRAM module 150. The eDRAM controller 112 is connected to the eDRAM module 150 through a plurality of input/output lines 131. These input/output lines provide a mechanism for the eDRAM module 150 and the set of processor cores 108 to communicate data to and from memory within the eDRAM module 150 via the eDRAM controller 112.

FIG. 1 is shown with the power supply 120 coupled to the eDRAM module with a plurality of switchable supply rails 122. The switchable supply rails 122 are provided to components of the eDRAM module 150 with mechanisms that allow for one or more of the switchable supply rails 122 to be powered down such that those components will not draw power when corresponding switchable supply rails 122 are powered down. Although not illustrated in FIG. 1, the power supply 120 is coupled to other components in the semiconductor integrated circuit package 100 and in at least one embodiment components such as the eDRAM controller 112, are coupled with the power supply 120 with other switchable supply rails such that those components may be powered down individually. In one embodiment the switchable supply rails 122 are supplied through a fully-integrated voltage regulator (FIVR) within the semiconductor integrated circuit package 100 with all voltage rails controlled by a power control unit (PCU) such as the eDRAM power management controller 113. Using such a PCU with FIVR, the switchable supply rails 122 may be turned on and off very rapidly. As such, latency between transitioning between eDRAM power states with different components powered on and off is drastically reduced.

In FIG. 1, the eDRAM module 150 is configured to implement multiple power states including a power-on state, a power-off state, and a self-refresh state. The eDRAM module 150 comprises an eDRAM power management agent 160 coupled with a memory array 180 that is comprised of a plurality of memory cache lines. The eDRAM power management agent 160 configured to transition the eDRAM module 150 between power states in response to power state transition commands issued by the eDRAM power management controller 113, wherein transitioning to a power-off state or self-refresh state reduces the amount of power consumed by the eDRAM module 150 as compared to the power-on state. In at least one embodiment, the eDRAM module 150 further comprises an eDRAM self-refresh module 170 coupled with the eDRAM power management agent 160 and the memory array 180 and configured to recharge capacitors autonomously in the memory array 180 to prevent a loss of data due to power leakage. This allows the eDRAM module 150 to take over responsibility for periodically refreshing its memory array 180 and thereby not require that the eDRAM module 150 maintain communication with another component to receive refresh commands. Further embodiments include other optional components such as a low power communication module 152 and eDRAM configuration module 154. These components require minimal power and are powered in all eDRAM power states. The low power communication module 152 provides a mechanism for the eDRAM power management controller 113 to communicate with the eDRAM module 150 even when all other input/output lines 131 are powered down. This allows the eDRAM module 150 to receive commands and configuration states to transition out of a self-refresh state and out of a power-off state. Additionally, the eDRAM configuration module 154 provides a mechanism for the eDRAM module 150 to maintain a set of configuration settings that persists between various power state transitions including settings relevant to the those transitions. In one embodiment, the eDRAM configuration module 154 includes settings that specify the power state of individual ways when the memory array 180 comprises multiple ways. Thus, individual ways may be flushed and powered down to enable finer-grain tradeoff between eDRAM power and performance benefits of using the eDRAM.

FIG. 1 shows the eDRAM power management controller 113 coupled with the set of processor cores 108 and eDRAM controller 112. In one embodiment, the eDRAM power management controller 113 comprises a low power communication module 117 that is utilized whenever the eDRAM module enters the self-refresh state or power-off state to maintain communication with the eDRAM module 150 to allow the eDRAM power management controller 113 to transition the eDRAM module 150 into another power state. Embodiments of eDRAM power management controller 113 comprises additional circuitry, logic, and/or instructions to provide additional capabilities. For example, in one embodiment the eDRAM power management controller 113 further comprises a power state monitor module 114 configured to react to one or more power states of one or more components within the semiconductor integrated circuit package, including the set of processor cores, by issuing power state transition commands to the EDRAM module. For example, the power state monitor module 114 can issue power state transition commands to the eDRAM module when one or more of the set of processor cores 108 enter a C-state defined by ACPI other than C0 or when one or more of the set of processor cores 108 enter C0. This module can then provide reactive eDRAM power state transitions based on the power states of other hardware components.

In another embodiment, the eDRAM power management controller 113 comprises an eDRAM power state instruction module 115. The eDRAM power state instruction module 115 is configured to react to software (e.g. operating systems or application) based control of the power state of the eDRAM module 150. For example, software may program a control register within the eDRAM power management controller 113 to give suggestions regarding the power state of the eDRAM module 150 or may issue explicit instructions regarding which power state to put the eDRAM module 150 into.

In another embodiment, the eDRAM power management controller 113 comprises an efficiency metric module 116. Capabilities of the efficiency metric module 116 will be further described with reference to FIG. 4 and FIG. 5.

These components allow the eDRAM power management controller 113 to make decisions regarding which power state to put the eDRAM module 150 into based on, at times, the power states of other hardware components and at other times based on software based suggestions. Ultimately, the power state transitions of the eDRAM module 150 can be decoupled from the C-state transitions of components within the semiconductor integrated circuit package. In other words, the eDRAM module may be put into a self-refresh mode or power-off mode regardless of whether other components, such as external memory (also known as main memory or off-package DRAM) or the set of processor cores 108. One benefit is that the exit of the set of processor cores 108 from a deeper C-state than C0 does not depend on, i.e. have to wait for, the exit of the eDRAM module 150 from the self-refresh or power-off states. Furthermore, the eDRAM module 150 can be put into the self-refresh or power-off states even when the set of processor cores 108 are in the active C0 if the particular workload is not utilizing, or would not benefit from, the eDRAM module 150.

Embodiments of the invention provide mechanisms and methods to manage the power usage of eDRAM. Though eDRAM provides many performance benefits over non-embedded DRAM, this benefit comes at the expense of utilizing additional power over merely utilizing non-embedded DRAM. Therefore, there is a performance versus power consumption trade-off created by utilizing and not utilizing eDRAM. As such, power management of eDRAM provides opportunities to save power consumption during the operation of a semiconductor integrated circuit package that includes eDRAM. These mechanisms is particularly useful to reduce power consumption whenever the performance benefit of utilizing the eDRAM is low. For example, there are times when one or more processor cores have low activity, i.e. are relatively idle, when it may be useful to have the eDRAM enter a low power state. Until now, eDRAM did not have low power states defined nor were mechanisms provided for managing the power consumption of eDRAM. Thus, embodiments of the invention include eDRAM power management including active power management and idle power management.

Active power management allows a system to reduce eDRAM power when some processing cores are active but eDRAM is not being actively accessed at full-bandwidth. Idle power management reduces a substantial portion of power consumed by eDRAM when eDRAM cannot be used to improve workload performance.

Further described are embodiments of infrastructure, hardware, software, and/or logic components to support the power management of eDRAM including three eDRAM power states. Thus, power management of eDRAM in one or more embodiments of the invention include the definition of three eDRAM power states: a power-on state, a power-off state, and a self-refresh state. These three power states (also referred to as operational states of the eDRAM) are introduced to minimize the power consumption of eDRAM while preserving the performance gains of active usage of eDRAM. The significance of these embodiments is readily apparent as they provide substantial power savings when an eDRAM is in the power-off or self-refresh states as compared with always maintaining an eDRAM in the power-on state. Further, embodiments of this invention incur little to no performance penalties when transitioning to the power-on power state.

When the eDRAM enters the power-off power state and the self-refresh power state, various components are powered off to conserve power. In one embodiment, the self-refresh power state allows the eDRAM to power off a plurality of input/output lines while enabling a self-refresh engine, such as one provided by the eDRAM self-refresh module 170, that periodically refreshes the charge on memory capacitors in the eDRAM to prevent the loss of data while in the self-refresh power state. Other embodiments allow the additional components within a semiconductor integrated circuit package power down. For example, during the self-refresh power state an eDRAM controller may be powered down. In another embodiment, a plurality of input/output lines from an eDRAM controller to the eDRAM may be powered down to conserve additional idle power during a self-refresh power state. Allowing the eDRAM module to enter a self-refresh power state means the eDRAM module can enter a lower power state when the processor is idle with or without first writing back dirty memory cache lines to external memory. Furthermore, since the eDRAM's memory is current, the eDRAM can be transitioned from the self-refresh power state to a power-on power state when additional memory access occurs without requiring access to external memory. When the processor cores are woken from any deep C-state, the transition from self-refresh power state to the power-on power state can be initiated in parallel with any sleep transitions for other components within the computer system, i.e. sleep exit for the external memory. As a result, transition latency for the eDRAM can be hidden behind the sleep transition for the other components. Thus the addition of a self-refresh power state to the eDRAM would incur little to no additional performance penalty on existing computer system designs.

When the eDRAM reaches the power-off power state, additional power savings can be achieved. For example, embodiments of the invention would allow a memory array in the eDRAM to be powered off. In other embodiments, additional components such as an eDRAM controller and communication links to the eDRAM can be powered down for even further savings. The result is the minimization of power consumption for the eDRAM and related components when the eDRAM is transitioned into the power-off state.

Figure 2:
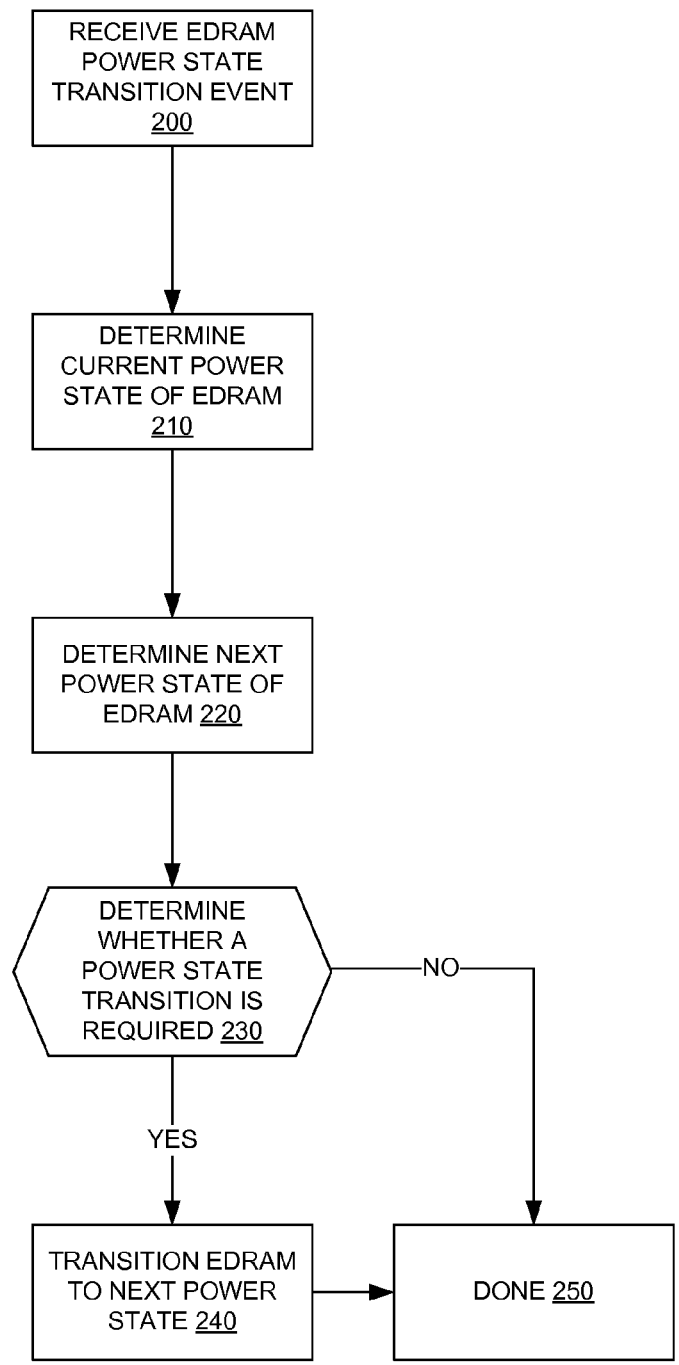
FIG. 2 illustrates a flow for utilizing eDRAM power states to reduce power consumption according to one embodiment of the invention.

FIG. 2 illustrates a flow for utilizing eDRAM power states to reduce power consumption according to one embodiment of the invention. FIG. 2 starts at 200 with a component, such as an eDRAM power management controller coupled with an eDRAM, receiving an eDRAM power state transition event. In some embodiments, the power state transition event is notification of the power state of one or more hardware components within a computing system the eDRAM is a component within. For example, the eDRAM power management controller is notified of one or more power states associated with a set of one or more processors coupled with the eDRAM power management controller. In other embodiments, eDRAM power state transition events including receiving instructions that indicate either explicit instructions for a power state transition at the eDRAM or suggestions that the eDRAM transition to a new power state. This way software may be written that leverages the additional eDRAM power states to provide programmatic methods of weighing performance versus power consumption.

The flow continues by determining the current power state of the eDRAM at 210. From there the flow continues by determining the next power state of the eDRAM 220. As described later, and particularly with reference to FIGS. 3-5, there are many methodologies that can be utilized to determine the next power state of the eDRAM.

The flow continues by determining whether a power state transition is required 230. For example, in the case that the current power state and next power state are the same then there is no need to transition power states. Furthermore, in the case that a power state is suggested by an instruction then there may be a component, logic, or additional instructions that determine whether that next state is truly beneficial. Thus, there may be mechanisms provided to supersede an instruction, for example if the eDRAM is currently in a state of high usage then an eDRAM power management controller may determine that a transition to the self-refresh state or power off state should not occur regardless of a received software instruction. Thus, when determined that no transition is required the flow ends at block 250. If it is determined that a power state transition should occur, then the flow continues by transitioning the eDRAM to the next power state 240.

The transition of the eDRAM to the next power state 240 behaves differently depending on the current power state and the next power state. For example, when the current power state is the power-on state then most, if not all, components for accessing and running the eDRAM will be operational and consuming power. Though at least one exception is that any self-refresh module present on the eDRAM will likely be in a power off state. Thus, transitioning to a self-refresh state involves powering down a plurality of input/outlines from the set of processors to the eDRAM and an eDRAM controller, powering down the eDRAM controller, and power on the eDRAM self-refresh module. Other embodiments may further enable a low power communication link between the eDRAM power management controller and the eDRAM to enable further communication of power management and configuration states between those components. A transition to a power-off state would further include writing any dirty memory cache lines back to main memory to prevent subsequent data loss and powering down the self-refresh module. However, a transition out of the power-off state or self-refresh state to the power on state would involve powering on those components that were powered off, reestablishing communication between the eDRAM controller and the eDRAM module. Additionally, some embodiments include built in hysteresis timers for the transition between power states. These timers prevent thrashing when transitioning multiple times between power states and thus allow the eDRAM power management module to determine an optimal time at which to transition the eDRAM to a power state.

Figure 3:
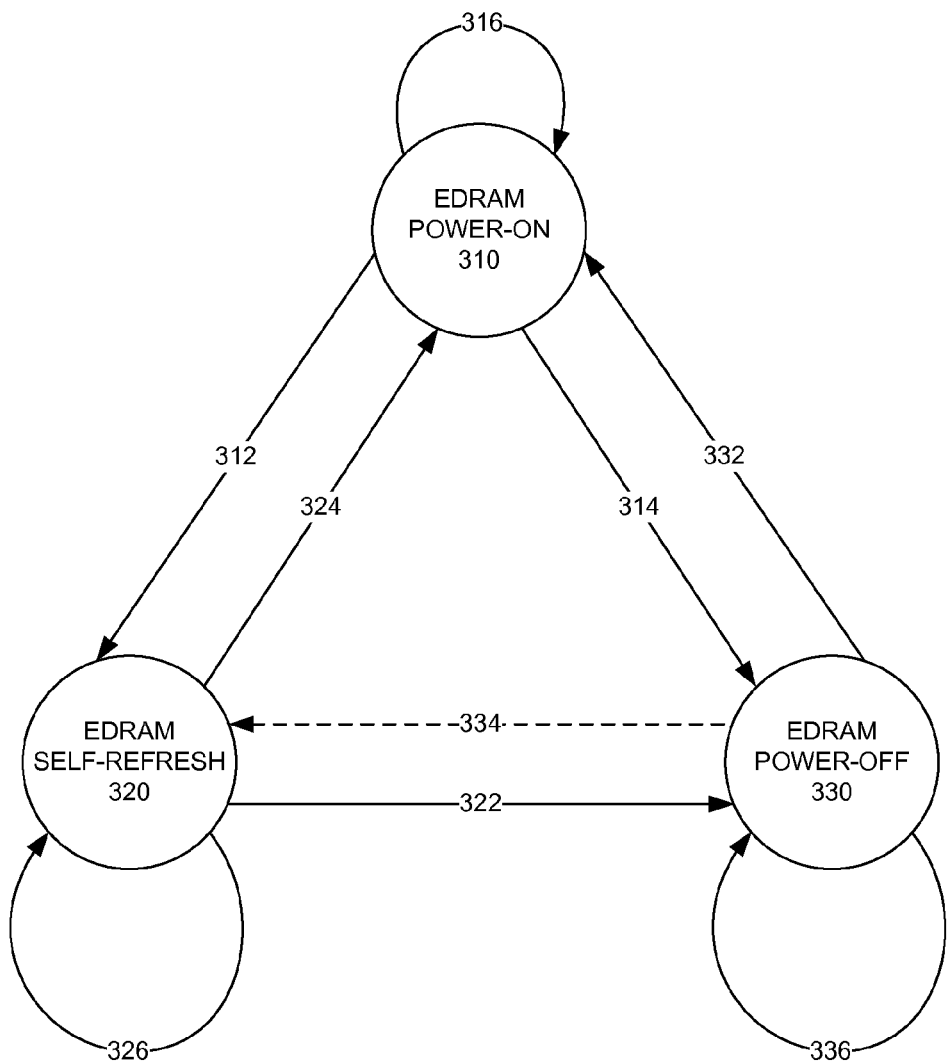
FIG. 3 is a state diagram illustrating eDRAM power states and the transitions between them according to an embodiment of the invention.

FIG. 3 is a state diagram illustrating eDRAM power states and the transitions between them according to an embodiment of the invention. In FIG. 3, three powers states exists: an eDRAM power-on state 310, an eDRAM self-refresh state 320, and an eDRAM power-off state 330. Transitions between each state are further illustrated. As such, when an eDRAM power state transition even occurs, the current power state of an eDRAM along with other factors can be considered to determine the next power state the eDRAM should be transitioned into.

When in the eDRAM power-on state 310, a transition can take the eDRAM into the eDRAM self-refresh state 320, this transition is shown as line 312. Another transition from the eDRAM power-on state 310 is shown as 314 going to the eDRAM power-off state 330. Lastly, it may be that it is determined that no transition should occur, thus transition 316 returns to the eDRAM power-on state 310.

When in the eDRAM self-refresh state 320, a transition can take the eDRAM into the eDRAM power-on state 310, this transition is shown as line 324. Another transition from the eDRAM self-refresh state 320 is shown as 322 going to the eDRAM power-off state 330. Lastly, it may be that it is determined that no transition should occur, thus transition 326 returns to the eDRAM self-refresh state 320.

When in the eDRAM power-off state 330, a transition can take the eDRAM into the eDRAM self-refresh state 320, this transition is shown as line 334. The transition 334 from the power-off state 330 to the self-refresh state 320 is shown in dashed marking to indicate its optional nature as many embodiment will receive little benefit going from the power-off state 330 to the self-refresh state 320 as there would be no memory contents to refresh. Another transition from the eDRAM power-off state 330 is shown as 332 going to the eDRAM power-on state 310. Lastly, it may be that it is determined that no transition should occur, thus transition 336 returns to the eDRAM power-off state 330.

In embodiments that enable the fine grained control of individual memory cache lines within an eDRAM memory array, each power state is representative of the power state of the particular memory cache line rather than the entire eDRAM memory array.

Many criteria may be applied when determining the next power state for eDRAM in the power state transition diagram. In one embodiment, the C-states of a set of one or more processors is considered in order to determine the next power state for an eDRAM. In such an embodiment, the lowest numbered C-state of any in the set of processors may be used to determine the next power state. The follow table demonstrates exemplary criteria for such an embodiment.

TABLE 1

First Exemplary Criteria for Determining Next eDRAM Power State

| Current eDRAM Power State | Processor C-State | Next eDRAM Power State |
|---|---|---|
| Power-On | C0 | Power-On |
| Power-On | C1 | Self-Refresh |
| Power-On | C2+ | Power-Off |
| Self-Refresh | C0 | Power-On |
| Self-Refresh | C1 | Self-Refresh |
| Self-Refresh | C2+ | Power-Off |
| Power-Off | C0 | Power-On |
| Power-Off | C1 | Power-Off |
| Power-Off | C2+ | Power-Off |

In another embodiment, additional factors may be presented such as a prediction of whether there a trade-off between power consumption and performance benefit would favor a particular power state. During operation, an eDRAM power management controller can evaluate one or more eDRAM efficiency metrics to predict if there would be a benefit to making a power state transition at the eDRAM and/or related components.

Figure 4:
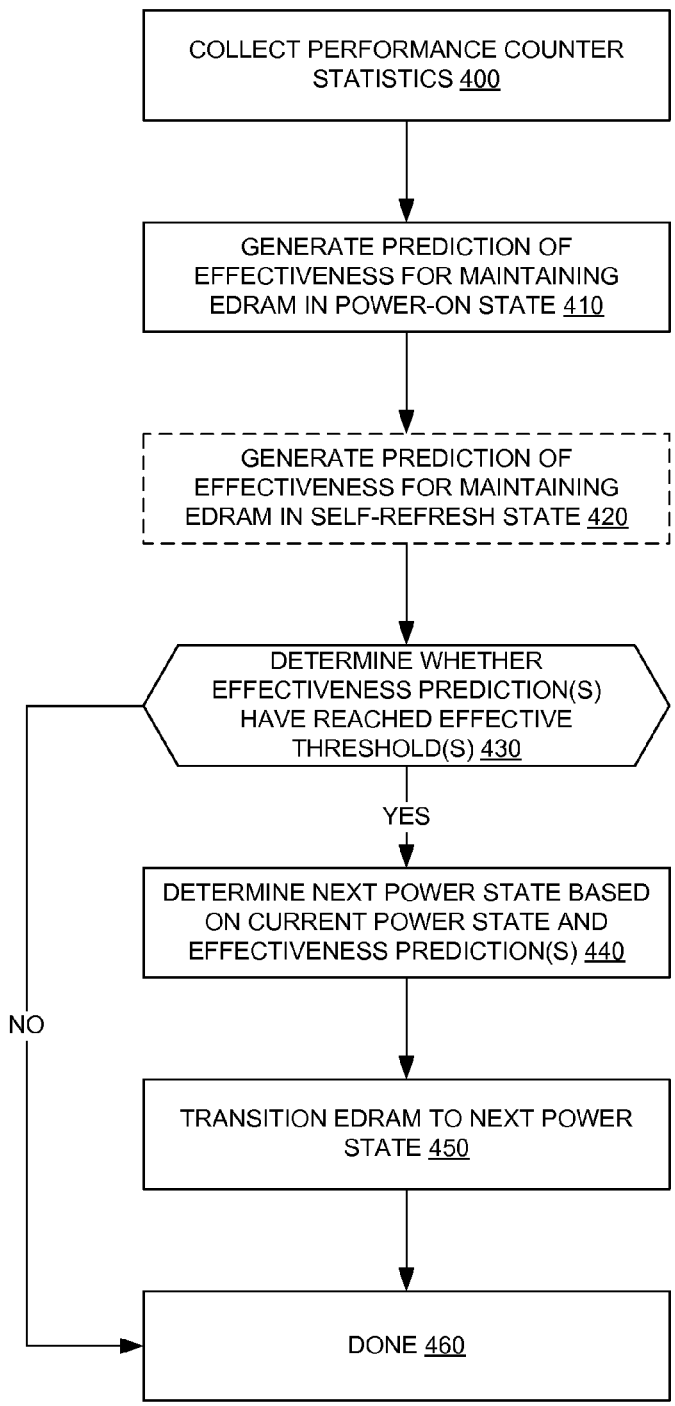
FIG. 4 illustrates a flow for utilizing eDRAM power versus performance benefit predictions according to one embodiment of the invention.

FIG. 4 illustrates a flow for utilizing eDRAM power versus performance benefit predictions according to one embodiment of the invention. FIG. 4 starts at 400 with a component, such as an efficiency metric module coupled with an eDRAM, collecting a set of one or more performance counter statistics. In this embodiment, a set of microarchitecture counters are selected and sampled by the efficiency metric module. During operation of various components, such as a set of processor cores, the main memory and the eDRAM, each of the set of counters are incremented in response to corresponding events. Microarchitecture counters can include any variable of measurable events that would be beneficial to predicting the cost to benefit ratio of maintaining the eDRAM in its various power states. For example, the microarchitecture counters may include memory intercepts, processor core frequency, memory stalls, cache misses, and memory bandwidth utilization.

The flow continues by generating a set of one or more predictions of the effectiveness for maintaining the eDRAM in a power-on state 410. In one embodiment, the flow continues by generating a set of one or more predictions of the effectiveness for maintaining the eDRAM in a state 420. The generation of effectiveness predictions can be more fully understood with reference to FIG. 5.

Figure 5:
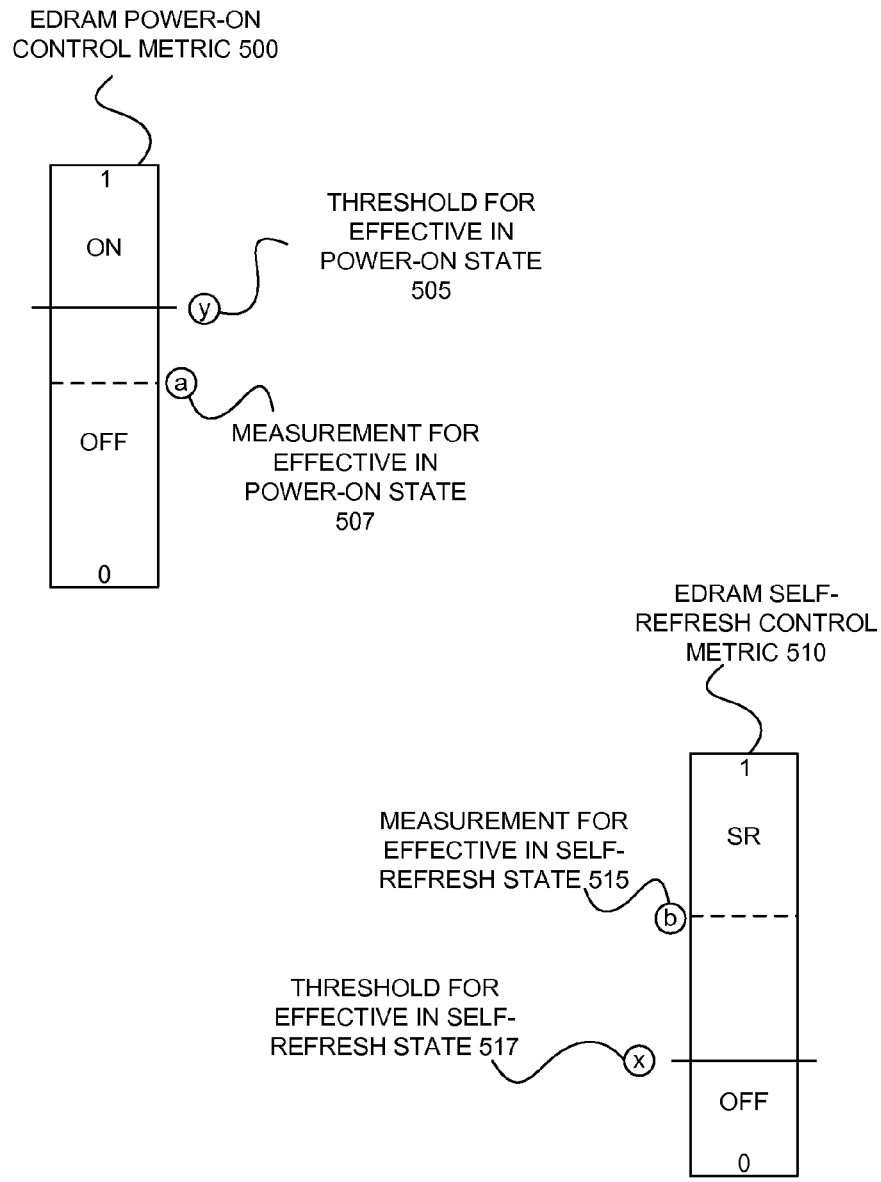
FIG. 5 illustrates performance metrics for predicting a trade-off between power consumption and performance benefit of eDRAM power states according to one embodiment of the invention.

FIG. 5 illustrates performance metrics for predicting a trade-off between power consumption and performance benefit of eDRAM power states according to one embodiment of the invention. FIG. 5 shows two eDRAM metrics, an eDRAM power-on control metric 500 and an eDRAM self-refresh control metric 510. Each metric is represented as a scale between 0 and 1, though the actual implementation may be any metric measurement scale. The eDRAM power-on control metric 500 is illustrated with a threshold 505 for predicting that the eDRAM would be effective in the power-on state. Furthermore, the eDRAM power-on control metric 500 is illustrated with a measurement 507 for the prediction that the eDRAM would be effective in the power-on state. In FIG. 5, the measurement 507 is less than threshold 505 for predicting that the eDRAM would be effective in the power-on state. Thus, the eDRAM power-on control metric 500 is predicting that the eDRAM would not be effective in the power-on state.

In one embodiment, the threshold 505 for predicting that the eDRAM would be effective in the power-on state is set externally. For example, a set of benchmarks can be collected to measure performance and power with an eDRAM in the power-on state, self-refresh state, and power-off state. Another method of developing benchmarks can be based on analysis using a set of multivariate linear regression models. Using either methodology a performance prediction PerfPrediction and power consumption PwrPrediction for a given set of metrics can be generated for the power-on state, self-refresh state, and power-off state. Using those predictions, efficiency rating metric (measurement for the effectiveness) of a given power state can be defined as the PerfPrediction divided by the PwrPrediction for that power state. When determining PerfPredictions and PwrPredictions, the various performance counters can be weighted according the measured or predicted weight those counters play into predicting the effectiveness of the eDRAM in a given power state.

In a similar note, the eDRAM self-refresh control metric 510 is illustrated with a threshold 515 for predicting that the eDRAM would be effective in the self-fresh state. Furthermore, the eDRAM self-refresh control metric 510 is illustrated with a measurement 517 for the prediction that the eDRAM would be effective in the self-refresh state. In FIG. 5, the measurement 517 is greater than threshold 515 for predicting that the eDRAM would be effective in the self-refresh state. Thus, the eDRAM self-refresh control metric 510 is predicting that the eDRAM would be effective in the self-refresh state.

Returning back to the discussion of FIG. 4, the flow continues by determining whether one or more of the set of effectiveness predictions (i.e. measurements for effectiveness) have crossed over the predetermined threshold for effectiveness for the given power states 430. If it is determined that none of the effectiveness predictions have crossed over the given thresholds, then the flow is done at 460. If it is determine that one or more of the effectiveness predictions have crossed over the given threshold, then the flow continues by determining the next power state based on the current power state and the set of effectiveness predictions 440. In this embodiment, the criteria for transitioning between power states can utilize additional criteria as compared to the criteria described in Table 1. For example, the following criteria may be used in one embodiment of the invention; in the following table the notation EEON is used to indicate that the measurement for whether the eDRAM is effective in the power-on state reached the predetermined threshold. To express logical criteria for eDRAM power state transition, the notation "!" denotes the "logical complement" operator, the "•" denotes the "logical and" operator, and the "+" denotes the "logical or" operator. Note in this embodiment of the invention, the eDRAM is in Self-Refresh whenever no cores are executing instructions (i.e. when its ACPI C-state is not C0). This power savings is possible as there is no additional performance penalty for waking the eDRAM from Self-Refresh as some core(s) are waking up from a non-C0 state.

TABLE 2

Second Exemplary Criteria for Determining
Next eDRAM Power State

| Current eDRAM Power State | Criteria | Next eDRAM Power State |
|---|---|---|
| Power-On | C0•EEON | Power-On |
| Power-On | !C0 | Self-Refresh |
| Power-On | C0•!EEON | Power-Off |
| Self-Refresh | C0•EEON | Power-On |
| Self-Refresh | !C0 | Self-Refresh |
| Self-Refresh | C0•!EEON | Power-Off |
| Power-Off | C0•EEON | Power-On |
| Power-Off | !C0 | Self-Refresh or Power-Off |
| Power-Off | C0•!EEON | Power-Off |

Yet another embodiment of the criteria for determining the next eDRAM power state is shown below; in the following table the notation EESR is used to indicate that the measurement for whether the eDRAM is effective in the self-refresh state reached the predetermined threshold.

TABLE 3

Third Exemplary Criteria for Determining
Next eDRAM Power State

| Current eDRAM Power State | Criteria | Next eDRAM Power State |
|---|---|---|
| Power-On | C0•EEON | Power-On |
| Power-On | !C0•EESR | Self-Refresh |

TABLE 3-continued

Third Exemplary Criteria for Determining Next eDRAM Power State

| Current eDRAM Power State | Criteria | Next eDRAM Power State |
|---|---|---|
| Power-On | C0•!EEON+!C0•!EESR | Power-Off |
| Self-Refresh | C0•EEON | Power-On |
| Self-Refresh | !C0•EESR | Self-Refresh |
| Self-Refresh | C0•!EEON+!C0•!EESR | Power-Off |
| Power-Off | C0•EEON | Power-On |
| Power-Off | !C0•EESR | Self-Refresh or Power-Off |
| Power-Off | C0•!EEON+!C0•!EESR | Power-Off |

While the flow diagrams in the figures show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 6A is a block diagram illustrating both an exemplary in-order pipeline and an exemplary register renaming, out-of-order issue/execution pipeline according to embodiments of the invention. FIG. 6B is a block diagram illustrating both an exemplary embodiment of an in-order architecture core and an exemplary register renaming, out-of-order issue/execution architecture core to be included in a processor according to embodiments of the invention. The solid lined boxes in FIGS. 6A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 6A, a processor pipeline 600 includes a fetch stage 602, a length decode stage 604, a decode stage 606, an allocation stage 608, a renaming stage 610, a scheduling (also known as a dispatch or issue) stage 612, a register read/memory read stage 614, an execute stage 616, a write back/memory write stage 618, an exception handling stage 622, and a commit stage 624.

FIG. 6B shows processor core 690 including a front end unit 630 coupled to an execution engine unit 650, and both are coupled to a memory unit 670. The core 690 may be a reduced instruction set computing (RISC) core, a complex instruction set computing (CISC) core, a very long instruction word (VLIW) core, or a hybrid or alternative core type. As yet another option, the core 690 may be a special-purpose core, such as, for example, a network or communication core, compression engine, coprocessor core, general purpose computing graphics processing unit (GPGPU) core, graphics core, or the like.

The front end unit 630 includes a branch prediction unit 632 coupled to an instruction cache unit 634, which is coupled to an instruction translation lookaside buffer (TLB) 636, which is coupled to an instruction fetch unit 638, which is coupled to a decode unit 640. The decode unit 640 (or decoder) may decode instructions, and generate as an output one or more micro-operations, micro-code entry points, microinstructions, other instructions, or other control signals, which are decoded from, or which otherwise reflect, or are derived from, the original instructions. The decode unit 640 may be implemented using various different mechanisms. Examples of suitable mechanisms include, but are not limited to, look-up tables, hardware implementations, programmable logic arrays (PLAs), microcode read only memories (ROMs), etc. In one embodiment, the core 690 includes a microcode ROM or other medium that stores microcode for certain macroinstructions (e.g., in decode unit 640 or otherwise within the front end unit 630). The decode unit 640 is coupled to a rename/allocator unit 652 in the execution engine unit 650.

The execution engine unit 650 includes the rename/allocator unit 652 coupled to a retirement unit 654 and a set of one or more scheduler unit(s) 656. The scheduler unit(s) 656 represents any number of different schedulers, including reservations stations, central instruction window, etc. The scheduler unit(s) 656 is coupled to the physical register file(s) unit(s) 658. Each of the physical register file(s) units 658 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 658 comprises a vector registers unit, a write mask registers unit, and a scalar registers unit. These register units may provide architectural vector registers, vector mask registers, and general purpose registers. The physical register file(s) unit(s) 658 is overlapped by the retirement unit 654 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 654 and the physical register file(s) unit(s) 658 are coupled to the execution cluster(s) 660. The execution cluster(s) 660 includes a set of one or more execution units 662 and a set of one or more memory access units 664. The execution units 662 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 656, physical register file(s) unit(s) 658, and execution cluster(s) 660 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 664). It should also be understood that where separate pipelines are used, one or more of these pipelines may be out-of-order issue/execution and the rest in-order.

The set of memory access units 664 is coupled to the memory unit 670, which includes a data TLB unit 672 coupled to a data cache unit 674 coupled to a level 2 (L2) cache unit 676. In one exemplary embodiment, the memory access units 664 may include a load unit, a store address unit, and a store data unit, each of which is coupled to the data TLB unit 672 in the memory unit 670. The instruction cache unit 634 is further coupled to a level 2 (L2) cache unit 676 in the memory unit 670. The L2 cache unit 676 is coupled to one or more other levels of cache and eventually to a main memory.

By way of example, the exemplary register renaming, out-of-order issue/execution core architecture may implement the pipeline 600 as follows: 1) the instruction fetch 638 performs the fetch and length decoding stages 602 and 604; 2) the decode unit 640 performs the decode stage 606; 3) the rename/allocator unit 652 performs the allocation stage 608 and renaming stage 610; 4) the scheduler unit(s) 656 performs the schedule stage 612; 5) the physical register file(s) unit(s) 658 and the memory unit 670 perform the register read/memory read stage 614; the execution cluster 660 perform the execute stage 616; 6) the memory unit 670 and the physical register file(s) unit(s) 658 perform the write back/memory write stage 618; 7) various units may be involved in the exception handling stage 622; and 8) the retirement unit 654 and the physical register file(s) unit(s) 658 perform the commit stage 624.

The core 690 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 690 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 634/674 and a shared L2 cache unit 676, alternative embodiments may have a single internal cache for both instructions and data, such as, for example, a Level 1(L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 7B:
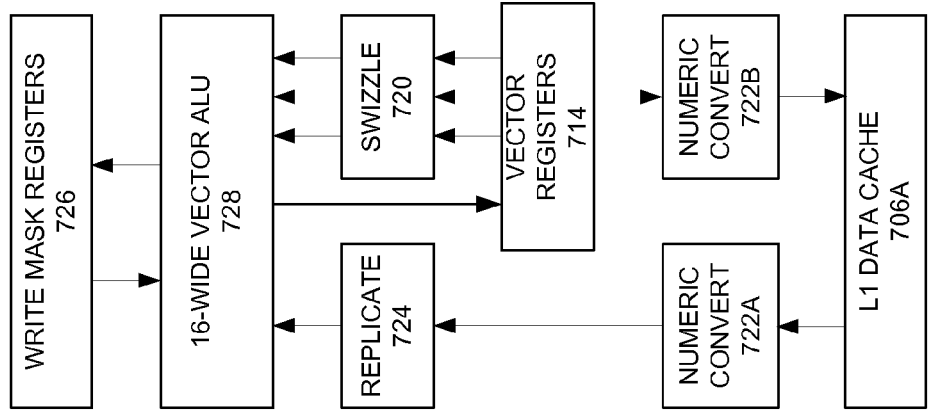
FIG. 7B is an expanded view of part of the processor core in FIG. 7A according to embodiments of the invention.
Figure 7A:
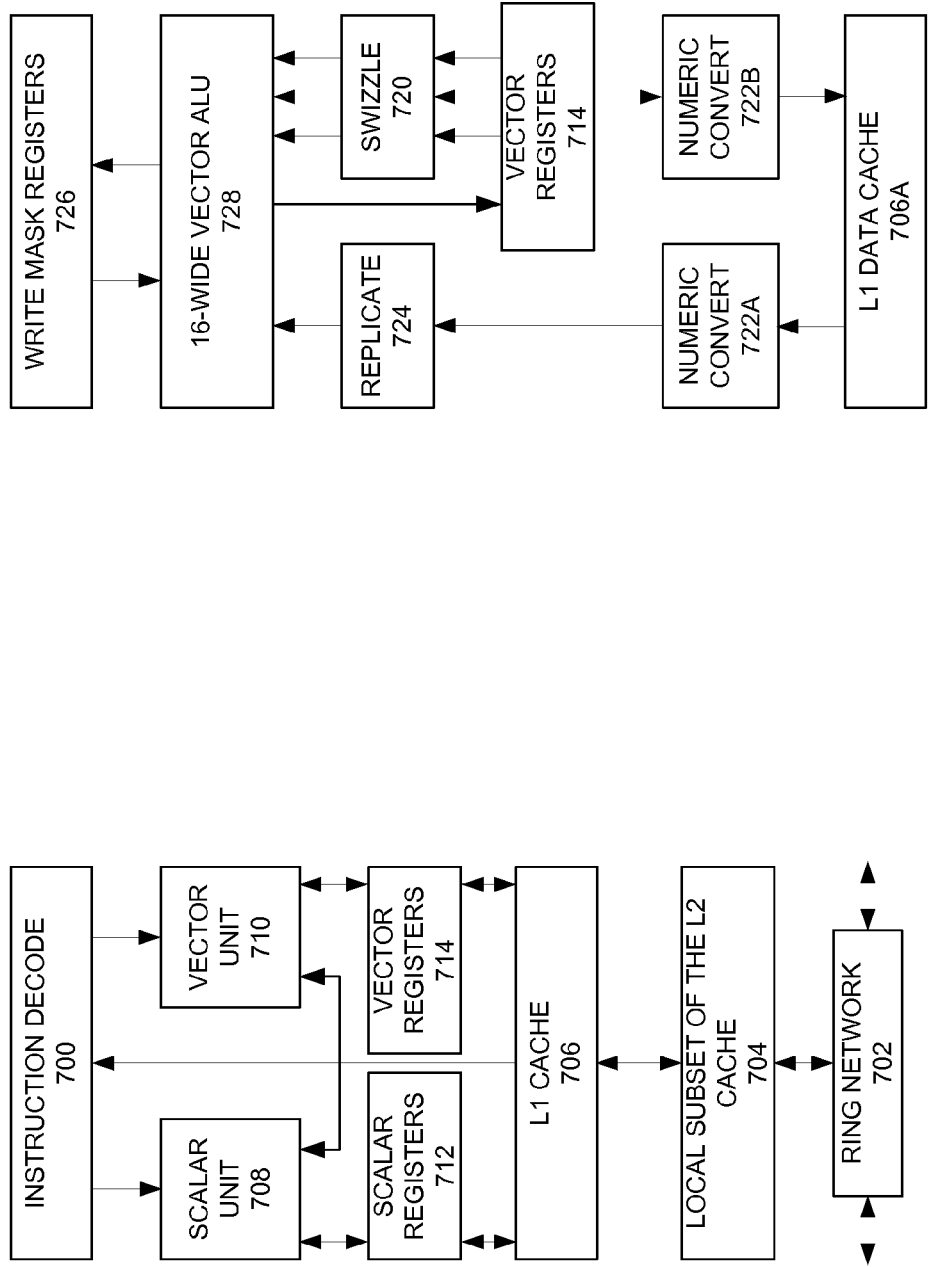
FIG. 7A is a block diagram of a single processor core according to embodiments of the invention.

FIGS. 7A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 7A is a block diagram of a single processor core, along with its connection to the on-die interconnect network 702 and with its local subset of the Level 2 (L2) cache 704, according to embodiments of the invention. In one embodiment, an instruction decoder 700 supports the x86 instruction set with a packed data instruction set extension. An L1 cache 706 allows low-latency accesses to cache memory into the scalar and vector units. While in one embodiment (to simplify the design), a scalar unit 708 and a vector unit 710 use separate register sets (respectively, scalar registers 712 and vector registers 714) and data transferred between them is written to memory and then read back in from a level 1(L1) cache 706, alternative embodiments of the invention may use a different approach (e.g., use a single register set or include a communication path that allow data to be transferred between the two register files without being written and read back).

The local subset of the L2 cache 704 is part of a global L2 cache that is divided into separate local subsets, one per processor core. Each processor core has a direct access path to its own local subset of the L2 cache 704. Data read by a processor core is stored in its L2 cache subset 704 and can be accessed quickly, in parallel with other processor cores accessing their own local L2 cache subsets. Data written by a processor core is stored in its own L2 cache subset 704 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 7B is an expanded view of part of the processor core in FIG. 7A according to embodiments of the invention. FIG. 7B includes an L1 data cache 706A part of the L1 cache 704, as well as more detail regarding the vector unit 710 and the vector registers 714. Specifically, the vector unit 710 is a 16-wide vector processing unit (VPU) (see the 16-wide ALU 728), which executes one or more of integer, single-precision float, and double-precision float instructions. The VPU supports swizzling the register inputs with swizzle unit 720, numeric conversion with numeric convert units 722A-B, and replication with replication unit 724 on the memory input. Write mask registers 726 allow predicating resulting vector writes.

Processor with Integrated Memory Controller and Graphics

Figure 8:
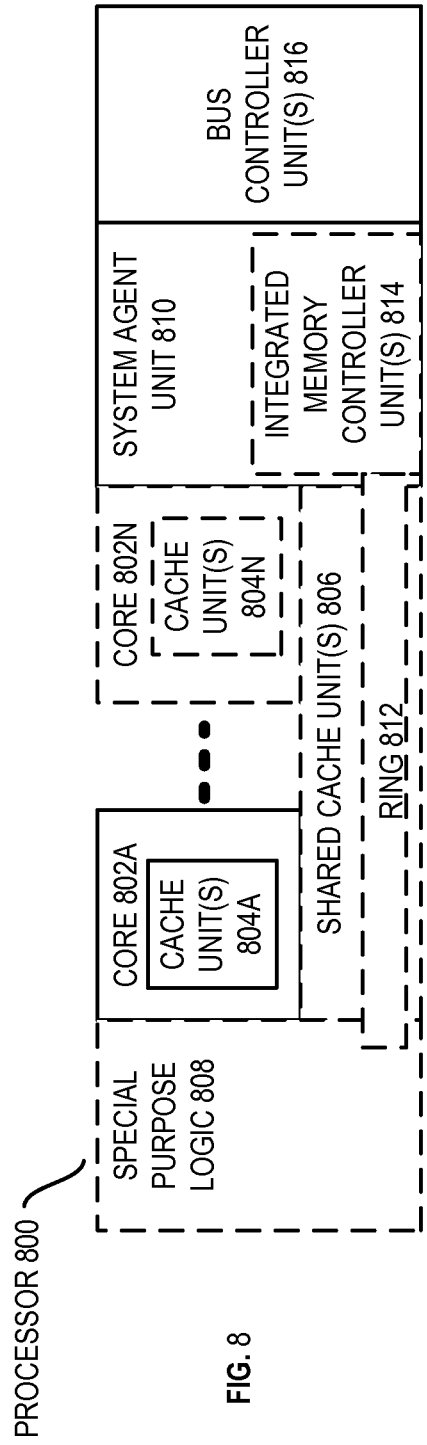
FIG. 8 is a block diagram of a processor according to embodiments of the invention.

FIG. 8 is a block diagram of a processor 800 that may have more than one core, may have an integrated memory controller, and may have integrated graphics according to embodiments of the invention. The solid lined boxes in FIG. 8 illustrate a processor 800 with a single core 802A, a system agent 810, a set of one or more bus controller units 816, while the optional addition of the dashed lined boxes illustrates an alternative processor 800 with multiple cores 802A-N, a set of one or more integrated memory controller unit(s) 814 in the system agent unit 810, and special purpose logic 808.

Thus, different implementations of the processor 800 may include: 1) a CPU with the special purpose logic 808 being integrated graphics and/or scientific (throughput) logic (which may include one or more cores), and the cores 802A-N being one or more general purpose cores (e.g., general purpose in-order cores, general purpose out-of-order cores, a combination of the two); 2) a coprocessor with the cores 802A-N being a large number of special purpose cores intended primarily for graphics and/or scientific (throughput); and 3) a coprocessor with the cores 802A-N being a large number of general purpose in-order cores. Thus, the processor 800 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 800 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 806, and external memory (not shown) coupled to the set of integrated memory controller units 814. The set of shared cache units 806 may include one or more mid-level caches, such as level 2 (L2), level 3 (L3), level 4 (L4), or other levels of cache, a last level cache (LLC), and/or combinations thereof. While in one embodiment a ring based interconnect unit 812 interconnects the integrated graphics logic 808, the set of shared cache units 806, and the system agent unit 810/integrated memory controller unit(s) 814, alternative embodiments may use any number of well-known techniques for interconnecting such units. In one embodiment, coherency is maintained between one or more cache units 806 and cores 802-A-N.

In some embodiments, one or more of the cores 802A-N are capable of multi-threading. The system agent 810 includes those components coordinating and operating cores 802A-N. The system agent unit 810 may include for example a power control unit (PCU) and a display unit. The PCU may be or include logic and components needed for regulating the power state of the cores 802A-N and the integrated graphics logic 808. The display unit is for driving one or more externally connected displays.

The cores 802A-N may be homogenous or heterogeneous in terms of architecture instruction set; that is, two or more of the cores 802A-N may be capable of execution the same instruction set, while others may be capable of executing only a subset of that instruction set or a different instruction set.

Exemplary Computer Architectures

FIGS. 9-12 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 9:
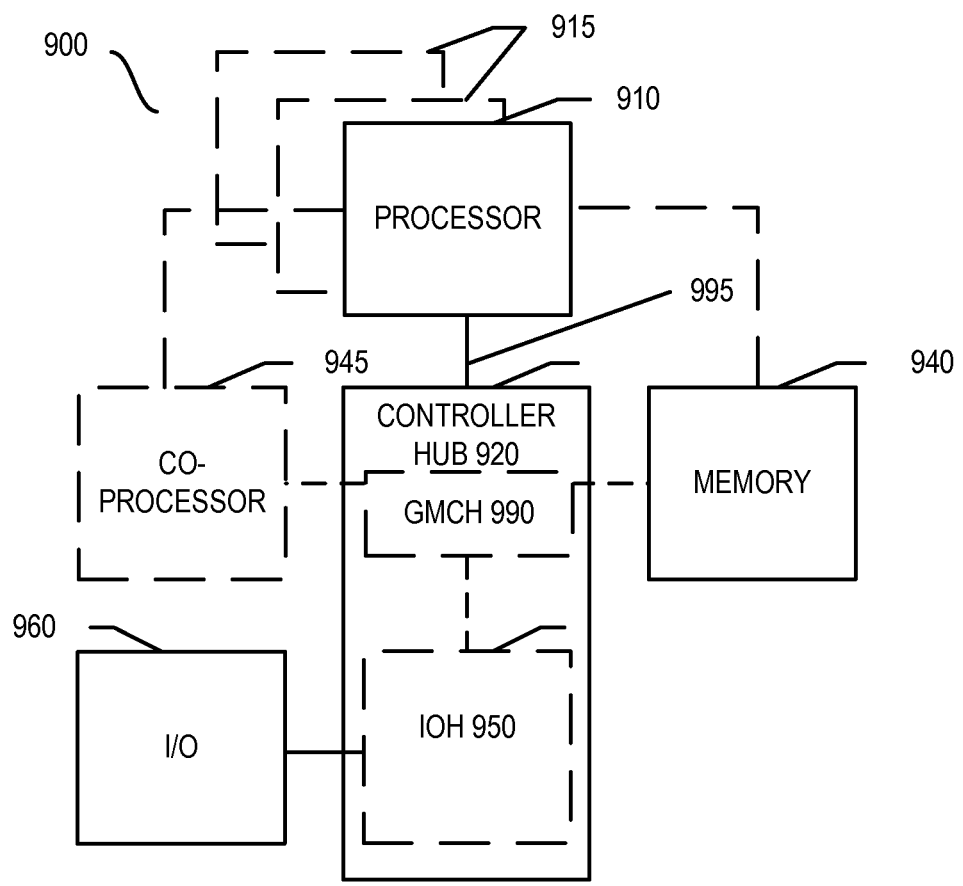
FIG. 9 is a block diagram of a system in accordance with one embodiment of the invention.

Referring now to FIG. 9, shown is a block diagram of a system 900 in accordance with one embodiment of the present invention. The system 900 may include one or more processors 910, 915, which are coupled to a controller hub 920. In one embodiment the controller hub 920 includes a graphics memory controller hub (GMCH) 990 and an Input/Output Hub (IOH) 950 (which may be on separate chips); the GMCH 990 includes memory and graphics controllers to which are coupled memory 940 and a coprocessor 945; the IOH 950 is couples input/output (I/O) devices 960 to the GMCH 990. Alternatively, one or both of the memory and graphics controllers are integrated within the processor (as described herein), the memory 940 and the coprocessor 945 are coupled directly to the processor 910, and the controller hub 920 in a single chip with the IOH 950.

The optional nature of additional processors 915 is denoted in FIG. 9 with broken lines. Each processor 910, 915 may include one or more of the processing cores described herein and may be some version of the processor 800.

The memory 940 may be, for example, dynamic random access memory (DRAM), phase change memory (PCM), or a combination of the two. For at least one embodiment, the controller hub 920 communicates with the processor(s) 910, 915 via a multi-drop bus, such as a frontside bus (FSB), point-to-point interface such as QuickPath Interconnect (QPI), or similar connection 995.

In one embodiment, the coprocessor 945 is a special-purpose processor, such as, for example, a high-throughput MIC processor, a network or communication processor, compression engine, graphics processor, GPGPU, embedded processor, or the like. In one embodiment, controller hub 920 may include an integrated graphics accelerator.

There can be a variety of differences between the physical resources 910, 915 in terms of a spectrum of metrics of merit including architectural, microarchitectural, thermal, power consumption characteristics, and the like.

In one embodiment, the processor 910 executes instructions that control data processing operations of a general type. Embedded within the instructions may be coprocessor instructions. The processor 910 recognizes these coprocessor instructions as being of a type that should be executed by the attached coprocessor 945. Accordingly, the processor 910 issues these coprocessor instructions (or control signals representing coprocessor instructions) on a coprocessor bus or other interconnect, to coprocessor 945. Coprocessor(s) 945 accept and execute the received coprocessor instructions.

Figure 10:
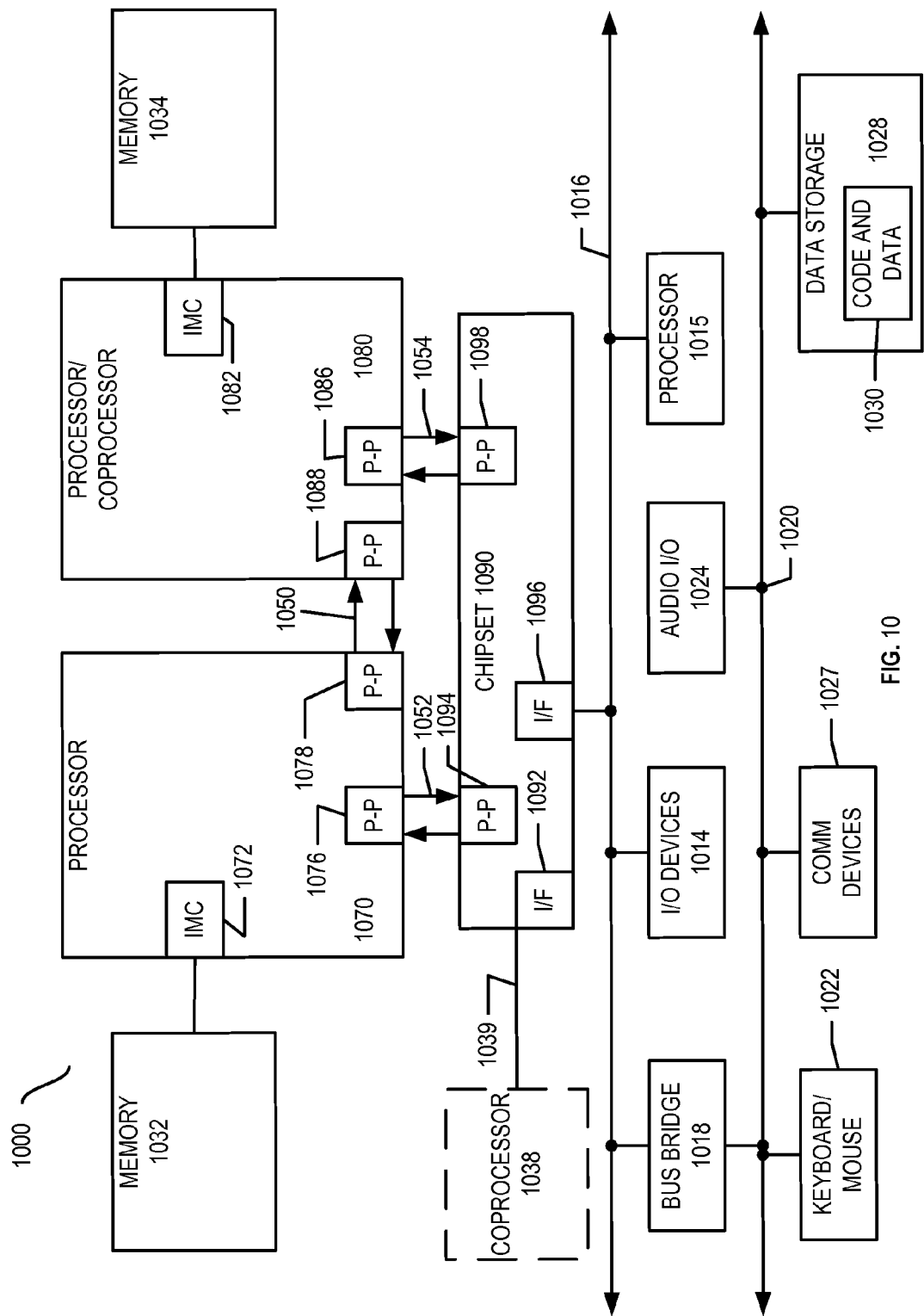
FIG. 10 is a block diagram of a first exemplary system in accordance with one embodiment of the invention.

Referring now to FIG. 10, shown is a block diagram of a first more specific exemplary system 1000 in accordance with an embodiment of the present invention. As shown in FIG. 10, multiprocessor system 1000 is a point-to-point interconnect system, and includes a first processor 1070 and a second processor 1080 coupled via a point-to-point interconnect 1050. Each of processors 1070 and 1080 may be some version of the processor 800. In one embodiment of the invention, processors 1070 and 1080 are respectively processors 910 and 915, while coprocessor 1038 is coprocessor 945. In another embodiment, processors 1070 and 1080 are respectively processor 910 coprocessor 945.

Processors 1070 and 1080 are shown including integrated memory controller (IMC) units 1072 and 1082, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 may each exchange information with a chipset 1090 via individual P-P interfaces 1052, 1054 using point to point interface circuits 1076, 1094, 1086, 1098. Chipset 1090 may optionally exchange information with the coprocessor 1038 via a high-performance interface 1039. In one embodiment, the coprocessor 1038 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present invention is not so limited.

As shown in FIG. 10, various I/O devices 1014 may be coupled to first bus 1016, along with a bus bridge 1018 which couples first bus 1016 to a second bus 1020. In one embodiment, one or more additional processor(s) 1015, such as coprocessors, high-throughput MIC processors, GPGPU's, accelerators (such as, e.g., graphics accelerators or digital signal processing (DSP) units), field programmable gate arrays, or any other processor, are coupled to first bus 1016. In one embodiment, second bus 1020 may be a low pin count (LPC) bus. Various devices may be coupled to a second bus 1020 including, for example, a keyboard and/or mouse 1022, communication devices 1027 and a storage unit 1028 such as a disk drive or other mass storage device which may include instructions/code and data 1030, in one embodiment. Further, an audio I/O 1024 may be coupled to the second bus 1020. Note that other architectures are possible. For example, instead of the point-to-point architecture of FIG. 10, a system may implement a multi-drop bus or other such architecture.

Figure 11:
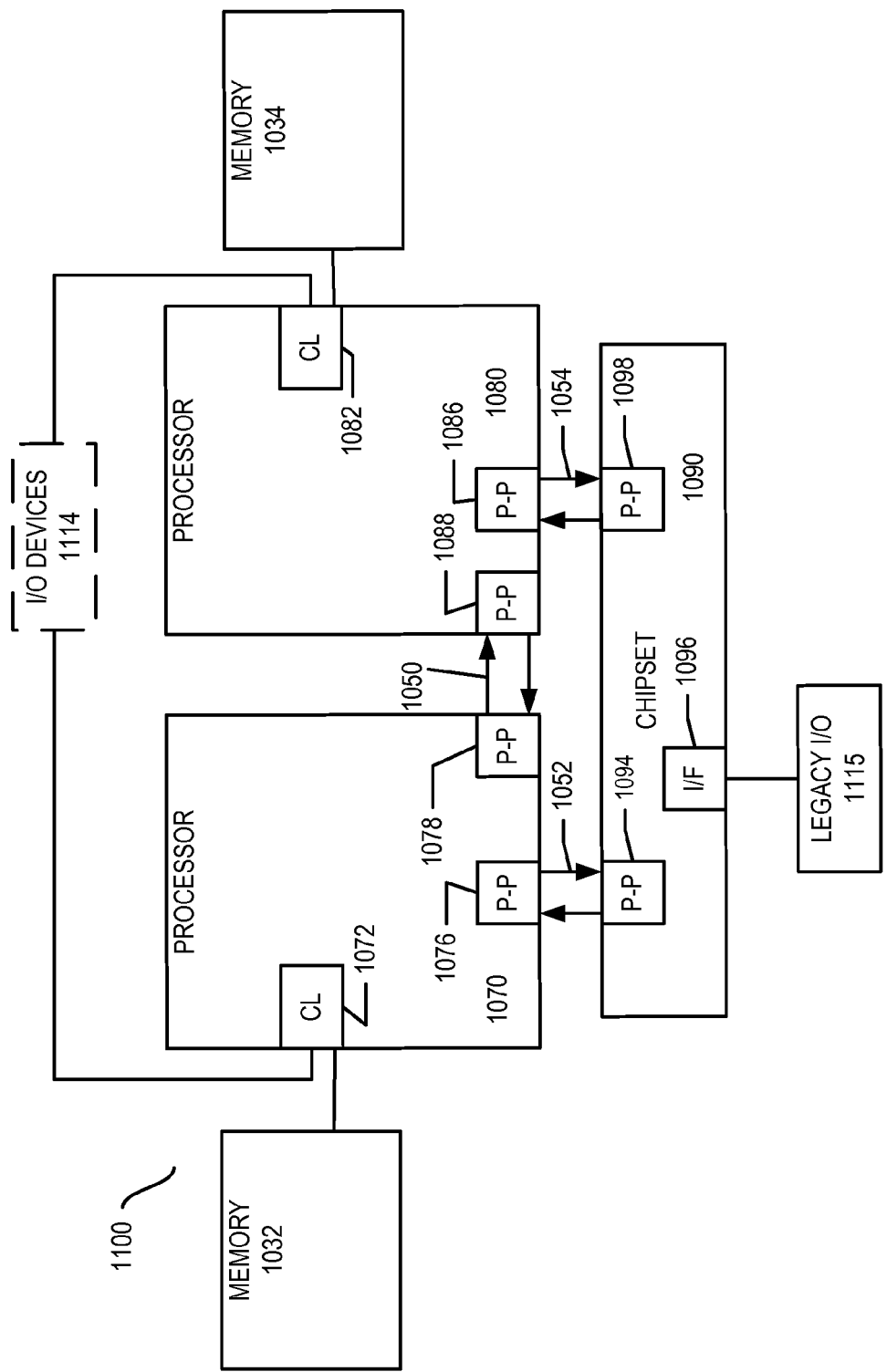
FIG. 11 is a block diagram of a second exemplary system in accordance with one embodiment of the invention.

Referring now to FIG. 11, shown is a block diagram of a second more specific exemplary system 1100 in accordance with an embodiment of the present invention. Like elements in FIGS. 10 and 11 bear like reference numerals, and certain aspects of FIG. 10 have been omitted from FIG. 11 in order to avoid obscuring other aspects of FIG. 11.

FIG. 11 illustrates that the processors 1070, 1080 may include integrated memory and I/O control logic ("CL") 1072 and 1082, respectively. Thus, the CL 1072, 1082 include integrated memory controller units and include I/O control logic. FIG. 11 illustrates that not only are the memories 1032, 1034 coupled to the CL 1072, 1082, but also that I/O devices 1114 are also coupled to the control logic 1072, 1082. Legacy I/O devices 1115 are coupled to the chipset 1090.

Figure 12:
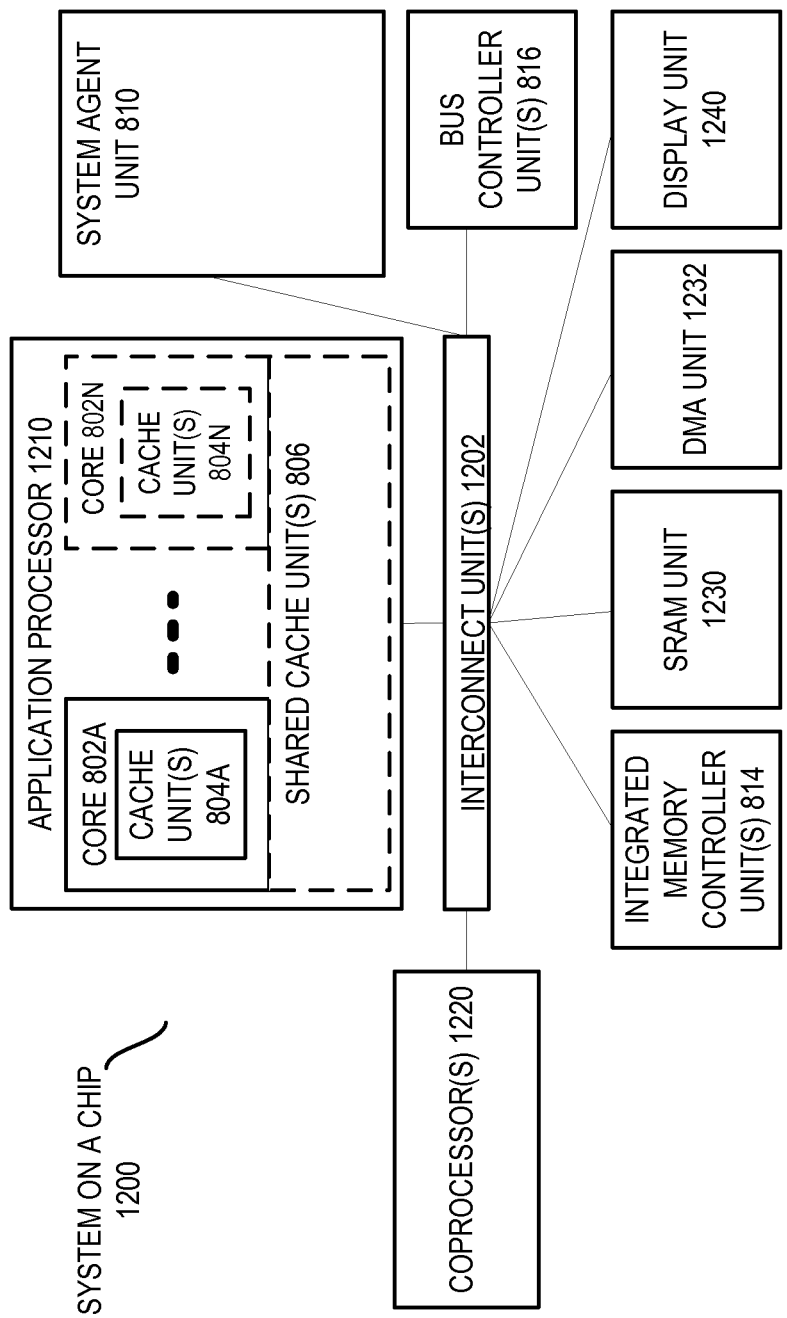
FIG. 12 is a block diagram of a system on a chip in accordance with one embodiment of the invention.

Referring now to FIG. 12, shown is a block diagram of a SoC 1200 in accordance with an embodiment of the present invention. Similar elements in FIG. 8 bear like reference numerals. Also, dashed lined boxes are optional features on more advanced SoCs. In FIG. 12, an interconnect unit(s) 1202 is coupled to: an application processor 1210 which includes a set of one or more cores 202A-N and shared cache unit(s) 806; a system agent unit 810; a bus controller unit(s) 816; an integrated memory controller unit(s) 814; a set or one or more coprocessors 1220 which may include integrated graphics logic, an image processor, an audio processor, and a video processor; an static random access memory (SRAM) unit 1230; a direct memory access (DMA) unit 1232; and a display unit 1240 for coupling to one or more external displays. In one embodiment, the coprocessor(s) 1220 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1030 illustrated in FIG. 10, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 13 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1304 represents a compiler that is operable to generate x86 binary code 1306 (e.g., object code) that can, with or without additional linkage processing, be executed on the processor with at least one x86 instruction set core 1316. Similarly, FIG. 13 shows the program in the high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1312 is used to convert the x86 binary code 1306 into code that may be natively executed by the processor without an x86 instruction set core 1314. This converted code is not likely to be the same as the alternative instruction set binary code 1310 because an instruction converter capable of this is difficult to make; however, the converted code will accomplish the general operation and be made up of instructions from the alternative instruction set. Thus, the instruction converter 1312 represents software, firmware, hardware, or a combination thereof that, through emulation, simulation or any other process, allows a processor or other electronic device that does not have an x86 instruction set processor or core to execute the x86 binary code 1306.

What is claimed is:

1. A semiconductor integrated circuit package comprising:
a set of one or more processor cores, each including a set of one or more execution units;
an embedded dynamic random access memory (EDRAM) power management controller coupled with the set of processor cores, the EDRAM power management controller configured to support multiple power states including a power-on state, a power-off state, and a self-refresh state by issuing power state transition commands; and
an EDRAM module coupled with the set of processor cores configured to implement multiple power states including a power-on state, a power-off state, and a self-refresh state, the EDRAM module comprising:
an EDRAM power management agent configured to transition the EDRAM module between power states in response to power state commands issued by the EDRAM power management controller, wherein transitioning to a power-off state or self-refresh state reduces the amount of power consumed by the EDRAM module as compared to the power-on state, and
a memory array coupled with the EDRAM power management agent that is comprised of a plurality of memory cache lines.

2. The semiconductor integrated circuit package of claim 1, wherein the EDRAM module further comprises a self-refresh module coupled with the memory array and the EDRAM power management agent, the self-refresh module configured to refresh a charge on the plurality of memory cache lines when the EDRAM module is in the self-refresh state without receiving additional refresh commands from an EDRAM controller or the set of processor cores.

3. The semiconductor integrated circuit package of claim 1, wherein the EDRAM power management controller comprises a EDRAM power state instruction module that is configured to react to EDRAM power state instructions by issuing power state transition commands to the EDRAM module based on a power state indicated in the power state instructions.

4. The semiconductor integrated circuit package of claim 1, wherein the EDRAM power management controller comprises a power state module configured to react to one or more power states of one or more components within the semiconductor integrated circuit package, including the set of processor cores, by issuing power state transition commands to the EDRAM module.

5. The semiconductor integrated circuit package of claim 1, wherein the EDRAM power management controller is further comprises a first low power communication module and the EDRAM module further comprises a second low power communication module coupled with the first low power communication module, wherein when the EDRAM module transitions to the power-off state a plurality input/output lines are powered off and additional communication from the EDRAM power management controller is communicated to the EDRAM module from the first low power communication module to the second low power communication module.

6. The semiconductor integrated circuit package of claim 1, wherein the EDRAM module is coupled with a power supply through a plurality of switchable supply rails.

7. The semiconductor integrated circuit package of claim 6, wherein when the EDRAM module transitions to the self-refresh state or the power-off state, one or more of the plurality of switchable supply rails is switched off to conserve power.

8. The semiconductor integrated circuit package of claim 7, wherein the plurality of switchable supply rails include supply rails to the EDRAM power management agent, an EDRAM self-refresh module, the EDRAM memory array, a low power communication module, and an EDRAM configuration module.

9. The semiconductor integrated circuit package of claim 1 where in the set of processor cores comprises a set of one or more general purpose processor cores.

10. The semiconductor integrated circuit package of claim 1 where in the set of processor cores comprises a set of one or more special purpose processor cores.

11. A method for power management of an embedded dynamic random access memory (EDRAM), the method comprising:
  receiving an EDRAM power state transition event;
  determining a current power state of the EDRAM, wherein the current power state is one of a power-on state, a power-off state, or a self-refresh state;
  determining the next power state of the EDRAM, wherein the next power state is one of a power-on state, a power-off state, or a self-refresh state;
  determining whether a power state transition is required; and
  in the case that a power state transition is required, transition the EDRAM to the next power state, wherein transitioning to a power-off state or self-refresh state reduces the amount of power consumed by the EDRAM as compared to the power-on state.

12. The method of claim 11, wherein determining the next power state comprises:
  determining a package power state of the set of processor cores; and
  utilizing the current power state, the package power state within a set of next power state logic, and hysteresis timers to determine the next power state and an optimal time to make the transition.

13. The method of claim 11, wherein the EDRAM power state transition occurs at different times that power state transitions of a set of one or more processor cores, thereby allowing the EDRAM power state transitions to occur without affecting power state transitions of the set of processor cores.

14. The method of claim 11, wherein the next power state is a power-off state, and transitioning the EDRAM to the next power state comprises:
  disabling access to the EDRAM;
  disabling a supply rail to an EDRAM controller to conserve power; and
  disabling and powering off a plurality of input/output lines to the EDRAM, wherein at least one input line to the EDRAM is enabled to allow additional power state transition commands to be sent to the EDRAM; and
  maintaining power to an always-on supply rail to provide power to an EDRAM configuration module within the EDRAM to save configuration data during the power-off state.

15. The method of claim 11, wherein the next power state is a self-refresh state, and transitioning the EDRAM to the next power state comprises:
  activating a self-refresh module within the EDRAM module; the self-refresh module configured to periodically recharge a plurality of memory cache lines within the EDRAM to maintain the contents of the EDRAM memory cache line until the EDRAM is transitioned out of the self-refresh mode whereby additional commands from an EDRAM controller to the EDRAM are not necessary to refresh the EDRAM; and
  disabling access to the EDRAM;
  disabling a supply rail to the EDRAM controller to conserve power; and
  disabling and powering off a plurality of input/output lines to the EDRAM, wherein at least one input line from an EDRAM power management controller to the EDRAM is enabled to allow additional power state transition commands to be sent to the EDRAM.

16. The method of claim 15, wherein a power state of a set of one or more processor cores is an active power state and the EDRAM is entering the self-refresh power state because the set of processor cores is performing a workload that does not require the EDRAM.

17. The method of claim 11, wherein the next power state is a power-on state, and transitioning the EDRAM to the next power state comprises:
  enabling a set of one or more switchable supply rails at the EDRAM that couple the EDRAM with a power supply and that were disabled during a power-off state or a self-refresh state, wherein one or more voltage ramps occurring in response to enablement of the set of switchable supply rails is controlled by an EDRAM power management controller; and
  enabling a plurality of input/output lines from the set of processor cores to the EDRAM to provide communication between the set of processor cores and the EDRAM;
  enabling a supply rail to an EDRAM controller; and
  enabling access to EDRAM.

18. The method of claim 17, wherein the powering up of the EDRAM controller and enabling access to the EDRAM require a first amount of time that is less than a second amount of time required by one or more other components to exiting a sleep state, thereby the first amount of time does not affect the performance of the system.

19. The method of claim 11, wherein the EDRAM power state transition event is receipt of a power state transition instruction indicating the desired power state transition.

20. The method of claim 19, wherein determining the next power state comprises determining whether the next power state can be entered respective to an operational state of a set of one or more processors cores coupled with the EDRAM and an operational state of the EDRAM.

* * * * *